US008910019B2

(12) United States Patent
Myung et al.

(10) Patent No.: US 8,910,019 B2
(45) Date of Patent: Dec. 9, 2014

(54) METHOD AND APPARATUS FOR VEILING AND DETECTING DATA USING AN ERROR CORRECTING CODE

(75) Inventors: Seho Myung, Seoul (KR); Bogyeong Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 13/591,894

(22) Filed: Aug. 22, 2012

(65) Prior Publication Data

US 2013/0055045 A1 Feb. 28, 2013

(30) Foreign Application Priority Data

Aug. 23, 2011 (KR) ........................ 10-2011-0084012

(51) Int. Cl.

| | |
|---|---|
| ***G11C 29/00*** | (2006.01) |
| ***H03M 13/00*** | (2006.01) |
| ***H03M 13/05*** | (2006.01) |
| ***G06F 11/10*** | (2006.01) |

(52) U.S. Cl.

CPC .............. *H03M 13/63* (2013.01); *H03M 13/05* (2013.01); *G06F 11/1048* (2013.01)

USPC ........................................... 714/763; 714/773

(58) Field of Classification Search

CPC .................................................. G06F 11/1048

See application file for complete search history.

(56) References Cited

U.S. PATENT DOCUMENTS

| | | | | |
|---|---|---|---|---|
| 4,328,542 | A * | 5/1982 | Anastas et al. | 711/163 |
| 6,229,731 | B1 * | 5/2001 | Kasai et al. | 365/185.04 |
| 6,490,668 | B2 * | 12/2002 | Hornung et al. | 711/165 |
| 6,931,576 | B2 * | 8/2005 | Morrison et al. | 714/54 |
| 8,285,927 | B2 * | 10/2012 | Flynn et al. | 711/113 |
| 8,423,788 | B2 * | 4/2013 | Holtzman et al. | 713/189 |
| 8,627,032 | B2 * | 1/2014 | Zbiciak | 711/163 |
| 2008/0034270 | A1 * | 2/2008 | Onishi et al. | 714/758 |
| 2011/0131459 | A1 * | 6/2011 | Tu et al. | 714/746 |
| 2012/0272052 | A1 * | 10/2012 | Wichmann et al. | 713/150 |

* cited by examiner

*Primary Examiner* — Daniel McMahon

(74) *Attorney, Agent, or Firm* — The Farrell Law Firm, P.C.

(57) ABSTRACT

An apparatus and method which uses error correcting code for veiling and detecting data is provided. The method includes encoding protected data using an Error Correcting Code (ECC); inserting a progression to the encoded protected data according to a preset rule; combining an error with the progression-inserted protected data; and storing the error-combined protected data in an arbitrary position in the memory.

12 Claims, 12 Drawing Sheets

PROTECTED DATA (610)
ENCODED DATA (620)
PROGRESSION-INSERTED DATA (630)
STORE MEMORY (650)
POSITION 1
SPACE FOR STORING PROGRESSION
POSITION 2
ERROR-COMBINED DATA (640)
POSITION 3
POSITION 4
: ERROR

METHOD AND APPARATUS FOR VEILING AND DETECTING DATA USING AN ERROR CORRECTING CODE

PRIORITY

This application claims priority under 35 U.S.C. §119(a) to Korean Patent Application Serial No. 10-2011-0084012, which was filed in the Korean Intellectual Property Office on Aug. 23, 2011, the entire disclosure of which is hereby incorporated by reference.

BACKGROUND OF THE INVENTION

1. Field of the Invention

The present invention relates generally to a method and apparatus for veiling and detecting data, and more particularly, to a method and apparatus for veiling and detecting data using an error correcting code.

2. Description of the Related Art

FIG. 1 illustrates a conventional method for veiling data.

Referring to FIG. 1, a memory is divided into position 1 (110), position 2 (120), position 3 (130), position 4 (140), and position 5 (150). Further, protected data is stored in position 3. For reference, the division of the memory can be a physical division, a virtual division, or a combination thereof.

When protected data is stored in such a manner, an authorized user should know the size and location of the protected data in order to retrieve the protected data. However, an unauthorized user should not know the size and location of protected data. Therefore, it is possible to effectively prevent unauthorized user from obtaining protected data.

However, when an unauthorized somehow knows the size of protected data, there is a danger that the unauthorized user may detect the protected data by dividing the entire memory area into units based on the size of the protected data, and then observing each divided area.

FIG. 2 illustrates a conventional process of veiling data based on an Error Correcting Code (ECC). Specifically, an ECC may be used to reduce the above-described danger.

Referring to FIG. 2, an error correcting code encoder 210 encodes protected data (m). The ECC is an extra code, which is generated according to a rule that can correct an error, when such an error occurs within the bits constituting a code. The ECC encoder 210 encodes protected data (m) using an ECC. Thereafter, an error generator 220 generates a pseudo random error (e) according to a predetermined rule, and combines the error with encoded data. Further, as a result of combination of errors, data is stored in an appropriate position of a memory 230. Basically, the data-stored position is determined according to the size of the encoded, protected data, as illustrated with reference to FIG. 1.

In FIG. 2, the conventional apparatus for veiling data combines an error and stores the combined data in the memory 230. As such, it is difficult for an unauthorized user to restore original data without knowledge on the ECC. That is, because the unauthorized user cannot know what error is included in the distorted, encoded data, it is more difficult for the unauthorized user to find important data. Further, it is difficult for the unauthorized user to remove an error without knowledge of decoding characteristics of the ECC. Therefore, according to the method illustrated in FIG. 2, the effect of preventing exposure of protected data can be obtained.

FIG. 3 illustrates a conventional process of veiling ECC-based data.

Referring to FIG. 3, an ECC encoder 310 encodes protected data (m) using an ECC. The encoded data is stored in a memory 320. Thereafter, data is output in a memory 330. An error generator 340 combines an error (e) with output data. Therefore, user is provided with error-combined data (v).

In FIG. 2, an error (e) is combined with encoded data, and the combined data is stored in the memory 230. In contrast, in FIG. 3, encoded data is stored in the memory 320 as itself, but when output to user, the data (v) is provided after being combined with an error (e).

Although the methods illustrated in FIGS. 2 and 3 make it difficult for an unauthorized user to obtain stored, protected data, they also make it more difficult for an authorized user to retrieve the stored, protected data due to the combination of an error.

Specifically, as the encoder uses an ECC with a high error-correcting ability, the number of errors combined increases. Further, an authorized user can also obtain desired data when proceeding with the decoding process of ECCs for the entire memory in order to obtain protected data. Further, the more artificial errors that are combined to effectively veil stored, protected data, the more superior ECCs are necessary. However, generally, the more superior the error-correcting capability is, the higher the decoding complexity is.

SUMMARY OF THE INVENTION

The present invention has been designed in view of the above-described problems, and provides at least the advantages described below.

An aspect of the present invention is to provide a method and apparatus for efficiently veiling and detecting data.

In accordance with an aspect of the present invention, a method for veiling protected data in a memory is provided. The method includes encoding protected data using an ECC; inserting a progression to the encoded protected data according to a preset rule; combining an error with the progression-inserted protected data; and storing the error-combined protected data in an arbitrary position in the memory.

In accordance with another aspect of the present invention, a data-veiling apparatus for veiling protected data in a memory is provided. The data-veiling apparatus includes an ECC encoder that encodes protected data using an ECC; a progression-inserting unit that inserts a progression to the encoded protected data, according to a preset rule; an error-combining unit that combines an error with the progression-inserted protected data; and a controller that stores the error-combined protected data in an arbitrary position in the memory.

In accordance with another aspect of the present invention, a method for detecting protected data stored in a memory is provided. The method includes extracting a progression according to a preset method from data of an arbitrary portion of the memory; estimating whether the protected data is stored in the arbitrary portion of the memory by comparing the extracted progression with a preset progression; removing the progression from the data of the arbitrary portion, if it is estimated that the protected data is stored in the arbitrary portion of the memory; and decoding the data after the progression has been removed, using an ECC.

In accordance with another aspect of the present invention, a data detecting apparatus for detecting protected data stored in a memory is provided. The apparatus includes a progression-extracting unit that extracts a progression according to a preset method in data of an arbitrary portion of the memory; a data position estimation unit that estimates whether the protected data is stored in the arbitrary portion of the memory by comparing the extracted progression with a preset progression; a decoded data extraction unit that removes the progression from the data of the arbitrary portion, if it is estimated that the protected data is stored in the arbitrary portion of the memory; and an error-correcting code decoder that decodes the data after the progression has been removed, using an error-correcting code.

BRIEF DESCRIPTION OF THE DRAWINGS

The above and other aspects, features, and advantages of the present invention will be more apparent from the following detailed description in conjunction with the accompanying drawings, in which.

DETAILED DESCRIPTION OF EMBODIMENTS OF THE INVENTION

Various embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 1:
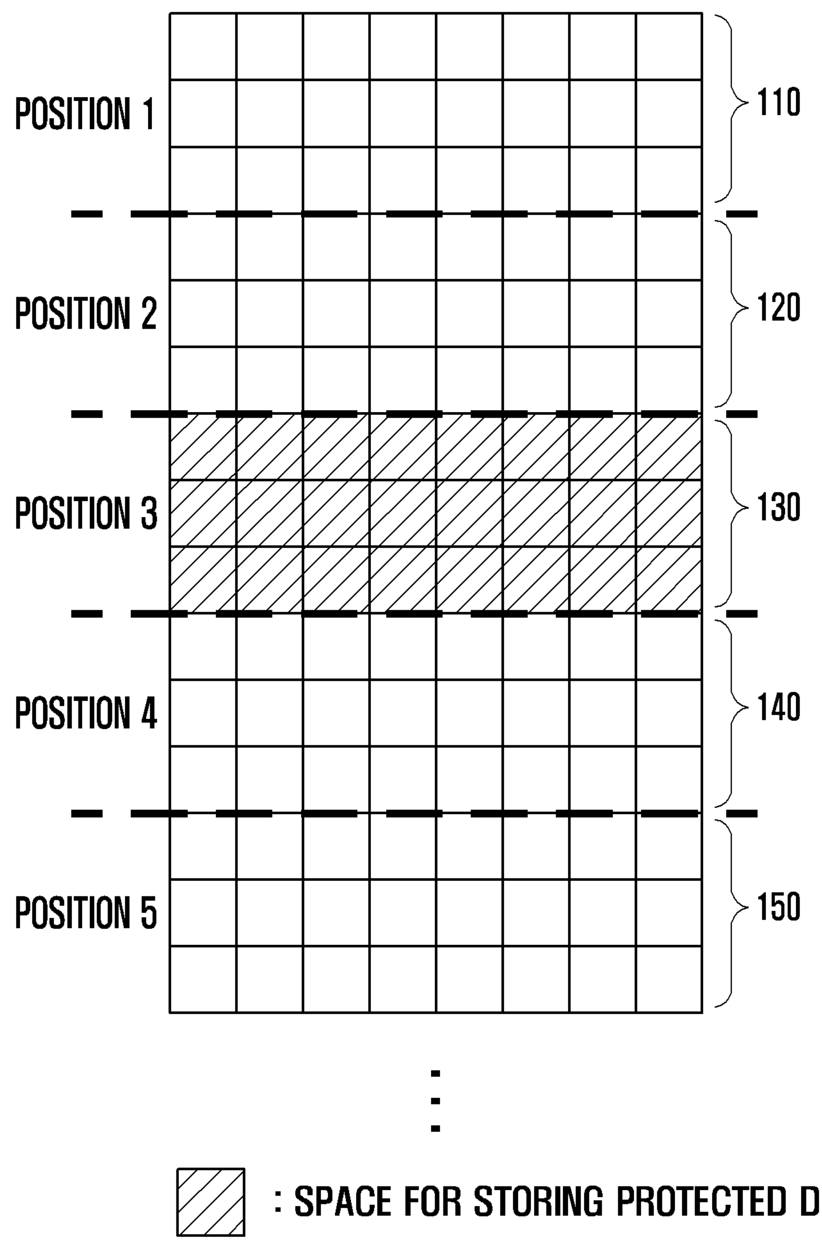
FIG. 1 illustrates a conventional method for veiling data.
Figure 2:
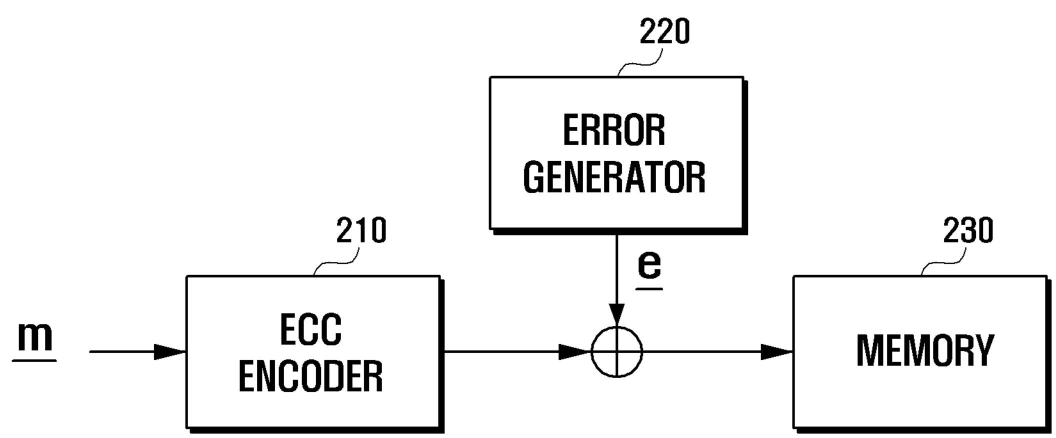
FIG. 2 illustrates a conventional process of veiling data based on an ECC.
Figure 3:
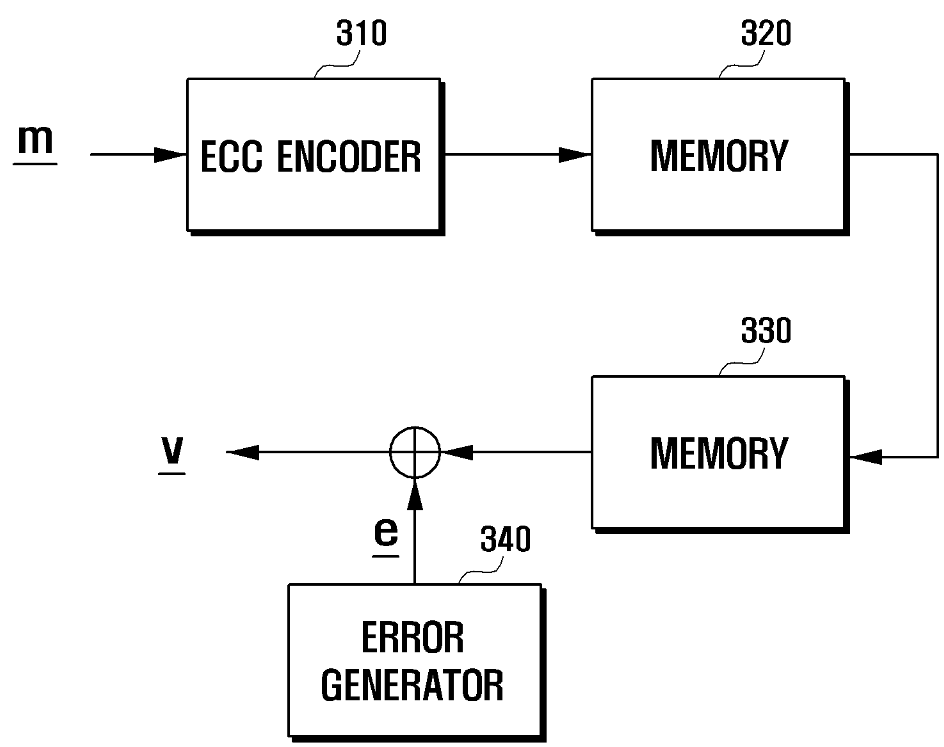
FIG. 3 illustrates a conventional process of veiling ECC-based data.
Figure 4:
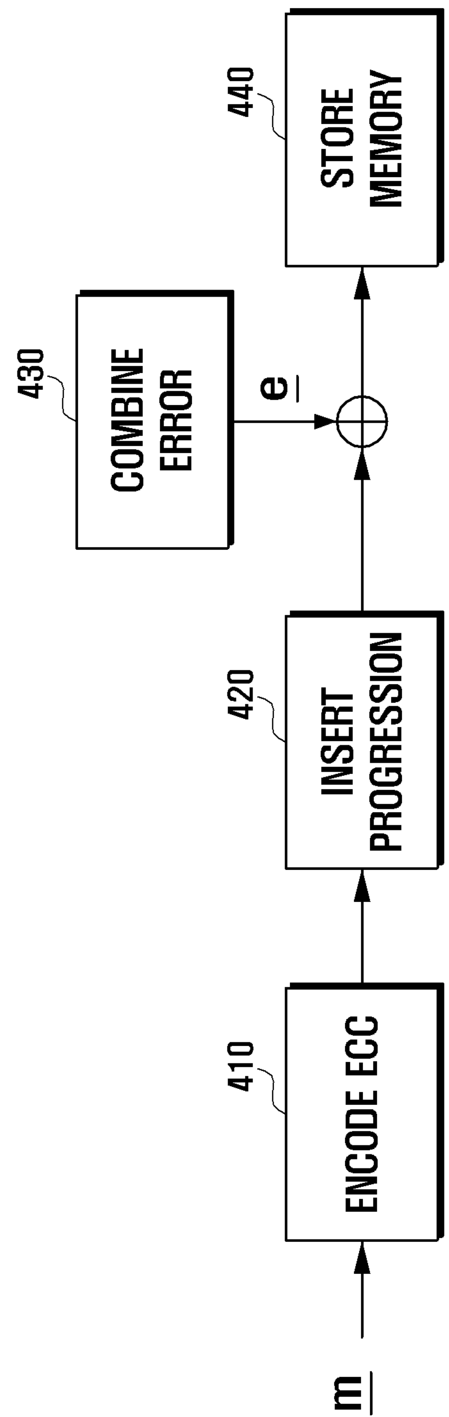
FIG. 4 illustrates a process of veiling data according to an embodiment of the present invention.

FIG. 4 illustrates a process of veiling data according to an embodiment of the present invention.

Referring to FIG. 4, an apparatus for veiling data encodes data to be stored (hereinafter, called "protected data") using an error correcting code in step 410, and then inserts a progression to the encoded data in step 420. The inserted position of a progression or other inserting rules of a progression to be inserted are predetermined.

In step 430, the apparatus combines an error with the data to which the progression has been inserted. The data to which the error has been combined is stored in a memory in step 440. Herein, it is assumed that the position at which the error has been combined can be stored in an arbitrary position in a unit based on the size of the data to which the error has been combined.

Figure 5:
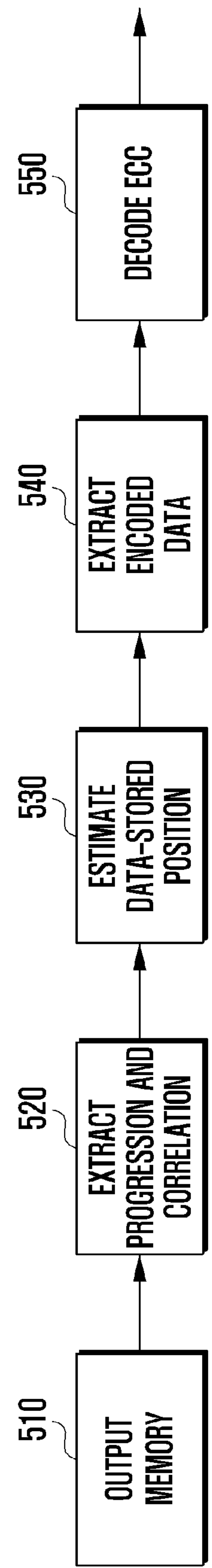
FIG. 5 illustrates a process of detecting veiled data according to an embodiment of the present invention.

FIG. 5 illustrates a process of detecting veiled data according to an embodiment of the present invention.

While embodiments of the present invention will be described below, wherein the size information of data to which an error has been combined has been made open to the public, the size information of the data to which the error has been combined can also be unpublished information. When the size information of the data to which the error has been combined is not known to the public, it would be possible to guess the size information according to the prior method. However, it is assumed that information on the coding method using an error correcting code and information on an inserted progression is known to only authorized users.

Referring to FIG. 5, a apparatus for detecting the veiled data outputs data from a memory in step 510. The apparatus extracts a progression from the output data according to predetermined rules in step 520. Further, the apparatus compares a correlation between the extracted progression and a predetermined progression. The higher the correlation between the progression extracted from a certain position and the predetermined progression is, the higher the possibility that the certain position is the position of veiled data is. Hence, the apparatus estimates the position of data stored through the comparison with the correlation in step 530.

The apparatus can set the positions of several candidates as a candidate for the position of the store data. However, if too many candidates are set, too many resources may be needed for restoration of stored data. In contrast, if too few candidates are set, the stored data may not be appropriately detected. Therefore, the number of candidates should be appropriately selected according to the system.

In step 540, the apparatus removes the extracted progression in the above-set candidate position, and extracts encoded data for performing restoration. The apparatus performs decoding using an ECC from the extracted encoded data, and thereby restores the stored data.

Figure 6:
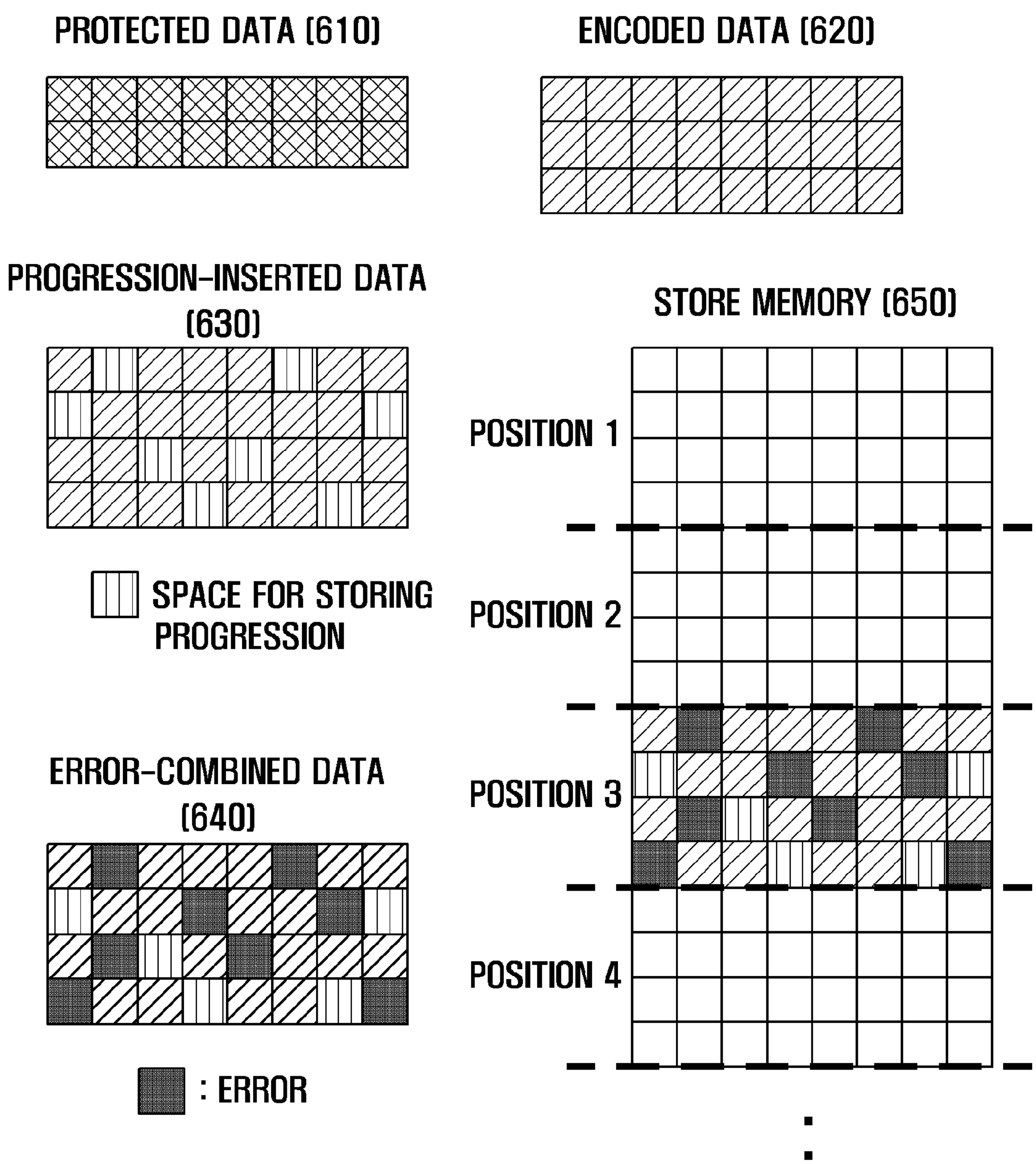
FIG. 6 illustrates a data conversion of a process of veiling data according to an embodiment of the present invention.

FIG. 6 illustrates a data conversion of a process of veiling data according to an embodiment of the present invention.

Referring to FIG. 6, an apparatus for veiling data encodes protected data 610 using an ECC, and generates encoded data 620. The apparatus then generates progression-inserted data 630 by inserting a predetermined progression to the encoded data 620. The apparatus then generates error-combined data 640 by combining an error with the progression-inserted data 630.

The error-combined data 640 is the stored in an appropriate position of a memory by dividing a memory area into unit based on a size of the error-combined data 640.

Herein, if the size of the encoded data 620 is determined, the size of the progression-inserted data 630 and the size of the error-combined data 640 are determined. Therefore, the division of the memory area can be performed according to the size of the encoded data 620.

The position at which the protected data is stored in the entire memory area is neither recorded nor known to any user. Accordingly, a user obtains protected data only after identifying at which portion the converted data of the protected data has been stored.

As described above, an apparatus for veiling data applies encoding using an ECC to data intended to be stored, inserts a predetermined progression, and then combines an error. Accordingly, the error combining step generates distortion in the previous inserted progression. As such, distortion is generated even in the correlation characteristics of the progression. Therefore, when an authorized user compares a correlation between a progression extracted in a certain position of data and a preset progression, the highest correlation may not guarantee an accurate data-stored position. Accordingly, the following process of estimating the data-stored position may be considered.

Process of Estimating the Data-Stored Position

1) An apparatus for detecting data extracts a progression for estimating a data-stored position at each part of a memory area, which is divided according to an encoded data size.

2) The apparatus compares the extracted progression with a predetermined progression, and obtains a correlation value. The correlation value can also be expressed as correlation or mutual relation.

3) A correlation value obtained for a certain memory is called "C". The following is determined with reference to a predetermined threshold (TH) and C (TH value can vary depending on the system environment):

if C>TH (or C≥TH), it is assumed that data is stored in the memory area; and in other cases, it is assumed that data is not stored in the memory area.

For example, it is assumed that the apparatus for detecting data estimates a position of storing data using a similar random progression whose length is 128.

Figure 7:
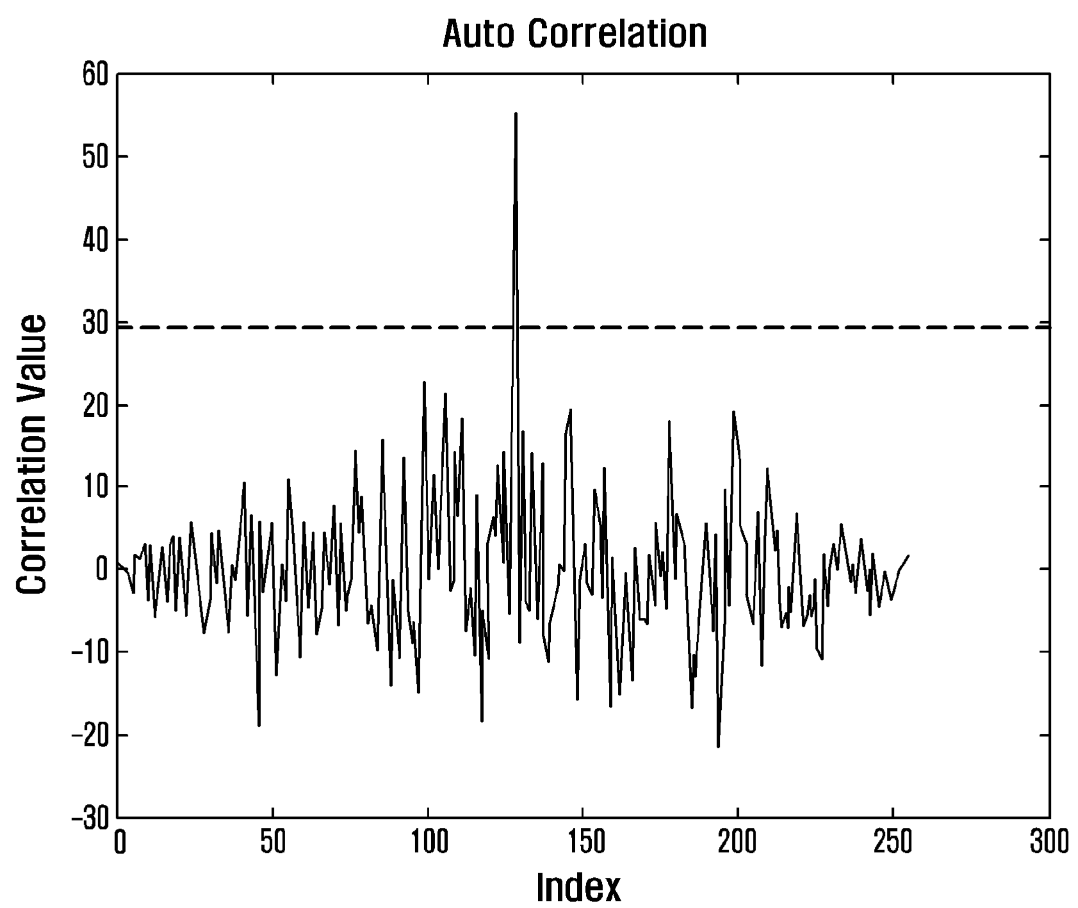
FIG. 7 is an auto-correlation graph where an error is combined with a similar random progression according to an embodiment of the present invention.

FIG. 7 is an auto-correlation graph where an error is combined with a similar random progression according to an embodiment of the present invention.

Referring to FIG. 7, the peak is shown when measuring correlation between two progressions by making the two progressions coincide with each other. The peak has a value of 128 when an error is not combined. However, when an error is combined with one of the two progressions, the correlation of the peak has a value lower than 128.

Accordingly, a threshold TH of the process of estimating the data-stored position should be appropriately set according to an amount of errors, which the apparatus combines with data. Then it is possible to estimate efficiently and accurately the position of data. For example, in FIG. 7, if TH value is set to 45, it is possible to estimate data relatively quickly and accurately.

When data to which an error has been combined contains many errors, the position having the highest correlation is not necessarily an accurate data-stored position. Therefore, a plurality of data storage position candidates can be extracted at step 3) above.

In such a case, the apparatus performs decoding using an ECC for each position candidate. The apparatus checks whether data at the corresponding position is data desired by an authorized user through the decoding process.

There are various methods for determining a progression and correlation used to estimate the position of data. Hence, the process of estimating the data-stored position, as described above, can be modified and applied in various forms. For example, it is assumed that a long progression S2=(S1, S1, . . . , S1) is made by repeating a short progression S1 by R times. Assuming that the data-stored position is assumed using S2, it is possible to assume the data-stored position according to the process of estimating the data-stored position using S2 as itself. However, it is also possible to estimate the data-stored position through the modified process of estimating the data-stored position described below.

Modified Process of Estimating the Data-Stored Position

1) The apparatus extracts a progression for estimating the data-stored position at each part of the memory area, which is divided according to the encoded data size.

2) The apparatus obtains a divided progression by dividing the extracted progression in the unit of the length of a predetermined progression S1. The apparatus repeatedly calculates the correlation value (C_1, C_2, . . . , C_R) between the progression S1 and the divided progression.

3) The apparatus makes the following decision with reference to thresholds TH1 and TH2 and correlation value C_i (TH1 and TH2 values can be changed according to the system requirement):

t is assumed that in the apparatus for detecting data, the number of cases, where a condition C_i>TH1 (or C_i≥TH1) is satisfied for i=1, 2, . . . , R, is the same as or greater than TH2, the data is stored in the position; and in other cases, it is assumed that the apparatus for detecting data is not stored in the position.

Figure 8:
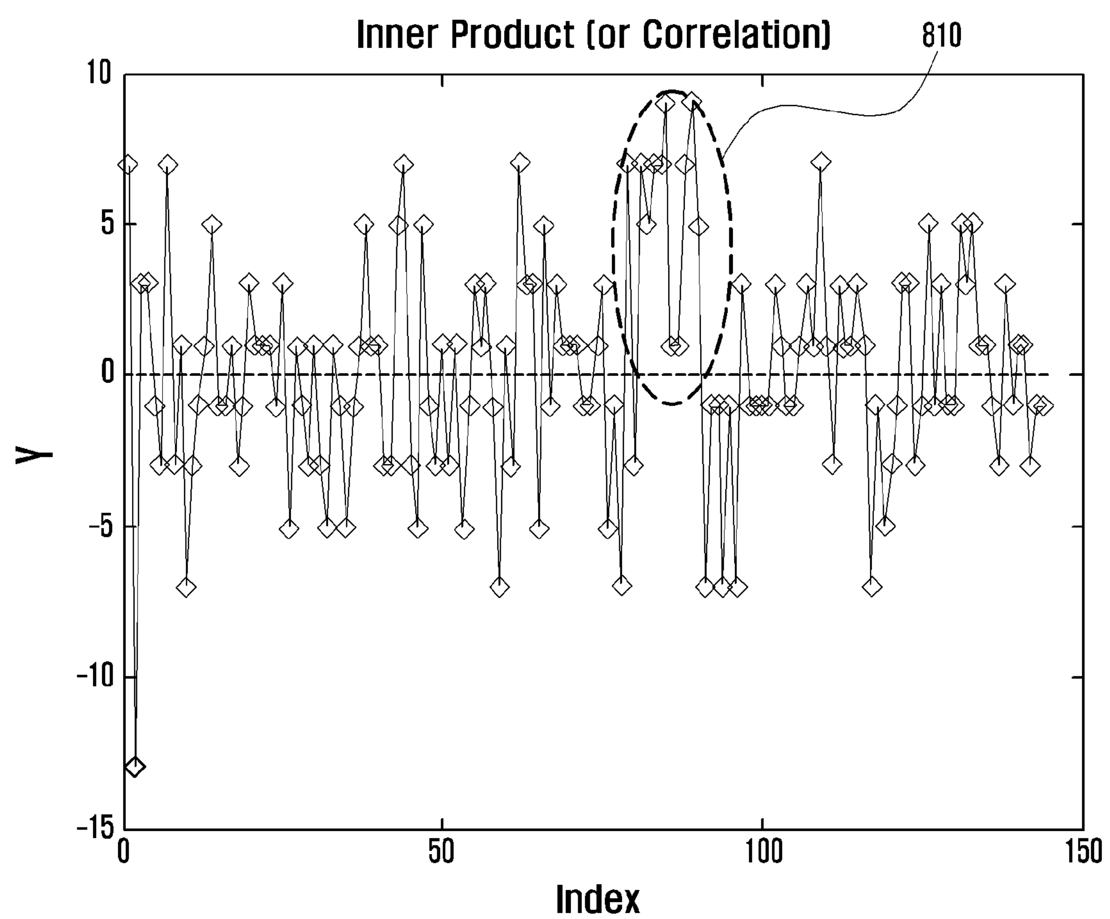
FIG. 8 is an auto-correlation graph illustrating a modified process of estimating a data-stored position according to an embodiment of the present invention.

FIG. 8 is an auto-correlation graph illustrating a modified process of estimating a data-stored position according to an embodiment of the present invention. Specifically, FIG. 8 illustrates a correlation graph for describing the characteristics of step 2) in the above-described modified process of estimating the data-stored position.

For example, it is assumed that the apparatus for detecting data estimates a data position using a progression which has repeated Barker's progression [1 1 1 1 1 −1 −1 1 1 −1 1 −1 1] whose length is 13 for 9 times.

Referring to FIG. 8, the graph indicates a uniquely determined position 810, when the condition is set to TH1=0 and TH2=9 in step 3) of the modified process of estimating the data-stored position described above. That is, because there are 11 partial progressions showing a correlation higher than threshold TH1 in the relationship with Barker's progression in the position 810, the apparatus estimates that data is stored in the position 810. Likewise, it should be noted that there can be various methods in addition to the modified process of estimating the data-stored position described above.

Figure 9:
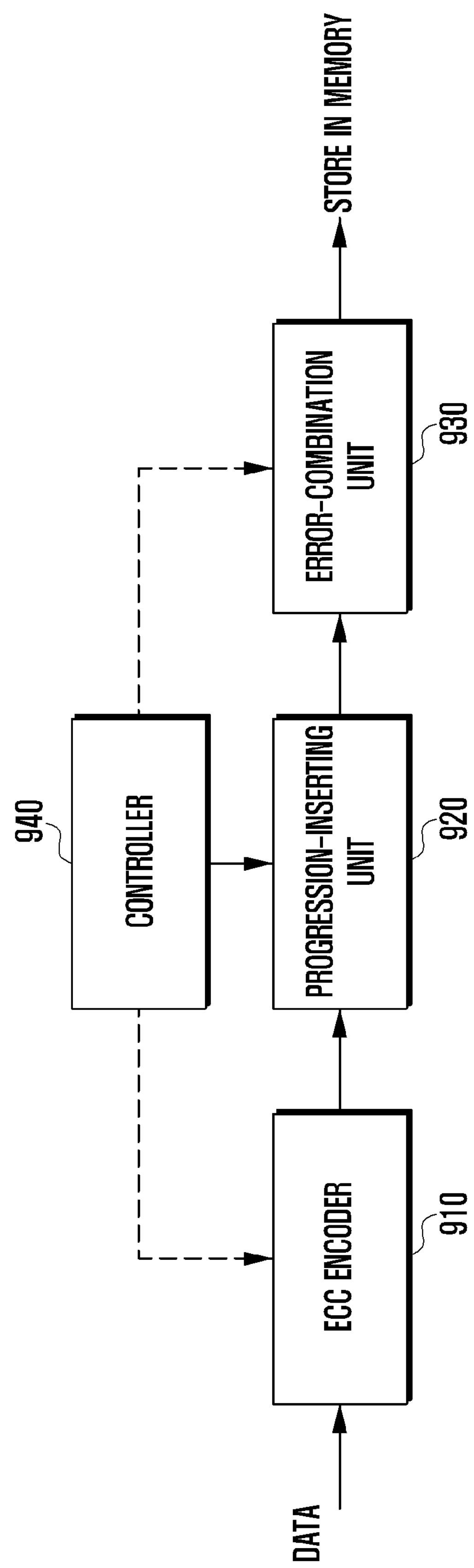
FIG. 9 is a block diagram illustrating an apparatus for veiling data according to an embodiment of the present invention.
Figure 10:
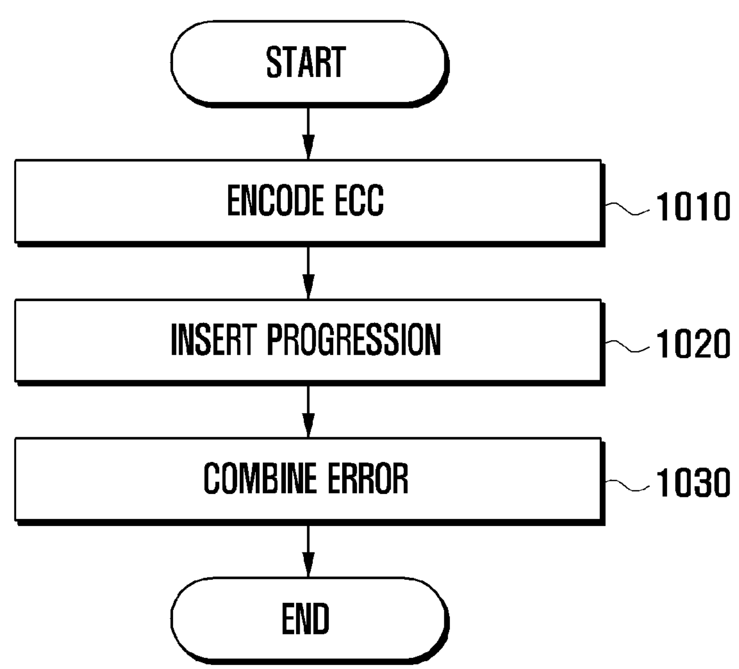
FIG. 10 is a flowchart illustrating a process of veiling data according to an embodiment of the present invention.

FIG. 9 is a block diagram illustrating an apparatus for veiling data according to an embodiment of the present invention, and FIG. 10 is a flowchart illustrating a process of veiling data according to an embodiment of the present invention.

Referring to FIGS. 9 and 10, an ECC encoder 910 encodes protected data using an ECC in step 1010. The protected data is transmitted to a progression inserting unit 920, which inserts a progression to the encoded data in step 1020. The progression-inserted data is transmitted to an error combining unit 930, which combines an error with the progression-inserted data in step 1030. The error-combined data is then stored in a memory (not shown).

A controller 940 controls the progression inserting unit 920 to insert a predetermined progression into the encoded data at a predetermined position according to a predetermined rule. Further, when the ECC encoder 910 dynamically changes and uses an error-correcting capability of an ECC, the controller 940 controls an encoding method of the ECC encoder 910. Further, the controller 940 controls the error-combining unit 930 so that the amount of errors combined with data can be appropriately adjusted according to the encoding method.

Figure 11:
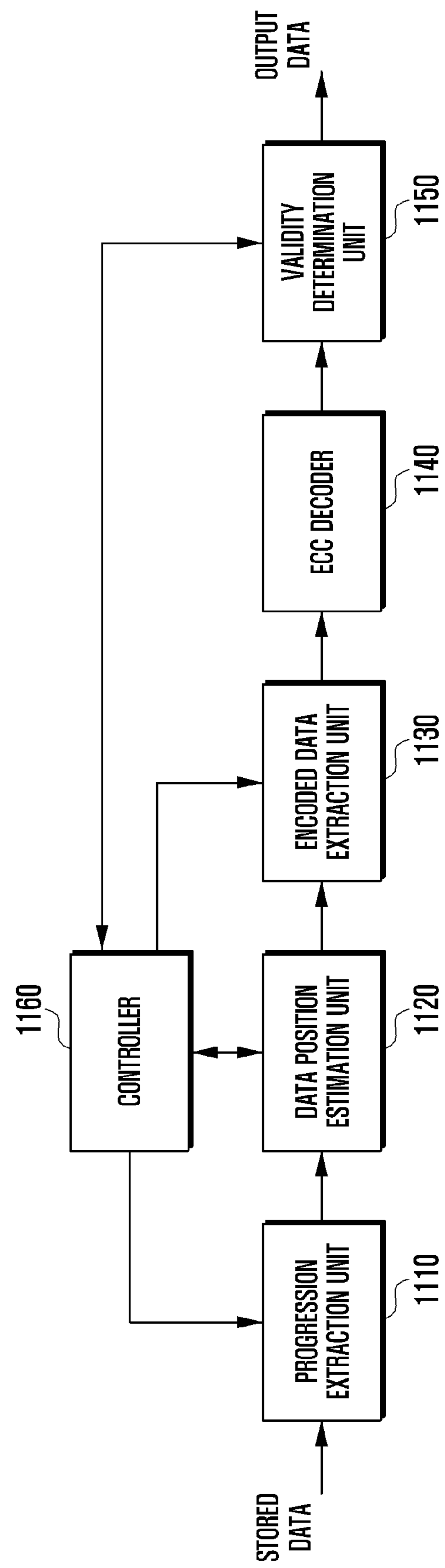
FIG. 11 is a block diagram illustrating an apparatus for detecting veiled data according to an embodiment of the present invention.
Figure 12:
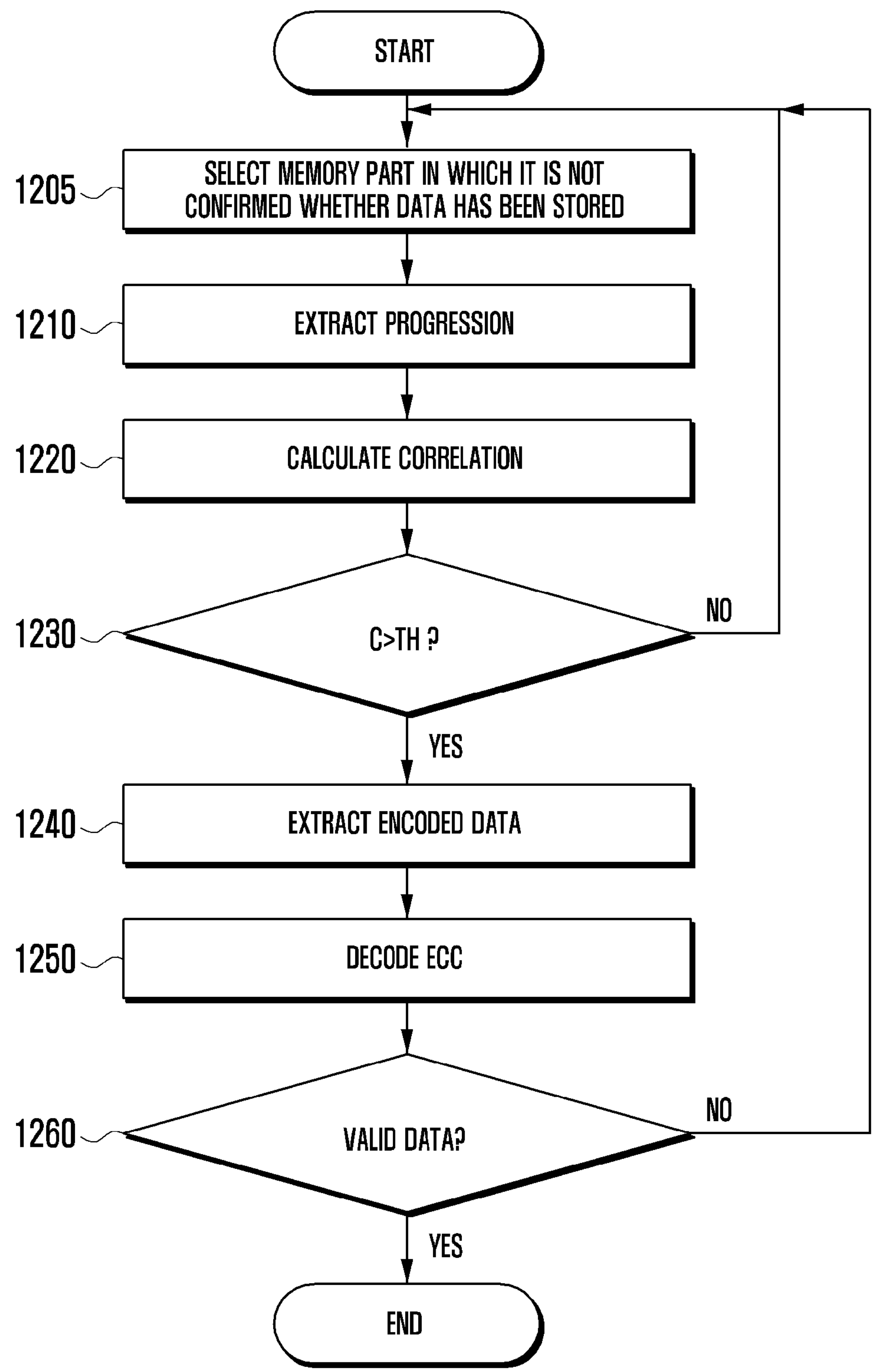
FIG. 12 is a flowchart illustrating a process of detecting veiled data according to an embodiment of the present invention.

FIG. 11 is a block diagram illustrating an apparatus for detecting data according to an embodiment of the present invention, and FIG. 12 is a flowchart illustrating a process of detecting data according to an embodiment of the present invention.

Referring to FIGS. 11 and 12, a controller 1160 selects a portion in which it is not confirmed whether data has been stored in an entire memory area in step 1205. For example, the controller 1160 can divide the entire memory area into units based on the size of error-combined data as illustrated in FIG. 6.

The following steps 1210 to 1260 can be performed for each divided portion of the memory before protected data is detected.

In step 1210, the progression extraction unit 1110 reads data stored in a memory, and extracts a progression corresponding to each portion. As described with reference to FIG. 6, protected data is stored in an arbitrary position among portions divided in a certain size unit from the entire memory area. The progression extraction unit 1110 extracts a progression corresponding to each portion of such a memory area.

In step 1220, the data position estimation unit 1120 calculates a correlation between a progression extracted in the progression extraction unit 1110 and a preset progression. The method of measuring a correlation will be described in more detail below.

In step 1230, the data position estimation unit 1120 determines whether the calculated correlation value exceeds a predetermined threshold. When the correlation is greater than the preset threshold, the data position estimation unit 1120 determines that the protected data is stored, transmits data of the corresponding position to the encoded data extraction unit 1130, which removes a progression from data of a portion which is presumed to have stored protected data in step 1240. Progression-removed data is transmitted to the ECC decoder 1140.

However, when the correlation value is the same as or smaller than the preset threshold in step 1230, the process returns to step 1210, and repeats the process of estimating whether protected data is stored in a non-confirmed portion among other portions of the memory area.

Although the process of estimating data-stored position, as described above, was used in steps 1220 and 1230, the modified process of estimating data-stored position described above may be alternatively used. Further, other alternative methods, which can infer or measure the correlation of a progression, may be used instead of steps 1220 and 1230.

In step 1250, the ECC decoder 1140 decodes the progression-removed data. In step 1260, the validity determination unit 1150 determines validity on whether decoded data is protected data desired by authorized user. For example, if it is expected that the type of the decoded data would be a text, but the type of the decoded data is not a text, it can be determined that the decoded data is not valid. Because the method of determining validity of other decoded data is a prior art, a detailed description of step 1260 is omitted here.

When the decoded data is valid data, the process ends. However, if the decoded data is invalid data in step 1260, the process returns to step 1210, data is read at an unconfirmed portion among other portions of the memory, and steps 1210 to 1260 are repeated.

The controller 1160 controls the progression extraction unit 1110 to extract a certain progression at an appropriate position of the stored data. Further, the controller 1160 operates the progression extraction unit 1110 or operates the encoded data extraction unit 1130 according to the result of the data position extraction unit 1120. Further, the controller 1160 re-operates the progression extraction unit 1110 or terminates all procedures according to the result of the validity determination unit 1150.

In the embodiments of FIGS. 11 and 12, the entire memory is divided, and thereafter, the progression correlation is checked for each divided portion, and the portion with a higher correlation is decoded. However, it is also possible to divide the entire memory area, then check the progression correlation for each divided portion, then select a candidate portion that is estimated to have stored protected data, and then decode the candidate portion.

According to a method and apparatus for veiling and detecting veiled data of the present invention, data can be efficiently veiled and detected.

Although certain embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims and their equivalents.

What is claimed is:

1. A method for veiling protected data in a memory, the method comprising:
- encoding protected data using an Error Correcting Code (ECC);
- inserting a progression of bits to the encoded protected data according to a preset rule;
- combining an error with the progression-inserted protected data; and
- storing the error-combined protected data in an arbitrary position in the memory.

2. The method of claim 1, wherein the progression of bits includes a repetition of short progressions of bits.

3. A data veiling apparatus for veiling protected data in a memory, the apparatus comprising:
- an Error Correcting Code (ECC) encoder that encodes protected data using an ECC;
- a progression-inserting unit that inserts a progression of bits to the encoded protected data, according to a preset rule;
- an error-combining unit that combines an error with the progression-inserted protected data; and
- a controller that stores the error-combined protected data in an arbitrary position in the memory.

4. The apparatus of claim 3, wherein the progression of bits includes a repetition of short progressions of bits.

5. A method for detecting protected data stored in a memory, the method comprising:
- extracting a progression of bits according to a preset method from data of an arbitrary portion of the memory;
- estimating whether the protected data is stored in the arbitrary portion of the memory by comparing the extracted progression of bits with a preset progression of bits;
- removing the progression of bits from the data of the arbitrary portion, if it is estimated that the protected data is stored in the arbitrary portion of the memory; and
- decoding the data after the progression of bits has been removed, using an Error Correcting Code (ECC).

6. The method of claim 5, wherein it is estimated that the protected data is stored in the arbitrary portion of the memory, when a correlation between the extracted progression of bits and the preset progression of bits exceeds a preset threshold.

7. The method of claim 5, wherein the preset progression of bits includes a repetition of preset short progressions of bits, and wherein estimating whether the protected data is stored in the arbitrary portion of the memory comprises:
- dividing the extracted progression of bits into divided progressions of bits in units based on a length of the short progression of bits;
- calculating a correlation between each of the divided progressions of bits and the short progression of bits; and
- estimating that the protected data is stored in the portion of the memory, when a number of the divided progressions of bits in which the calculated correlation exceeds a first threshold, is larger than a second threshold.

8. The method of claim 5, further comprising determining whether the decoded data is valid data.

9. A data detecting apparatus for detecting protected data stored in a memory, the apparatus comprising:

a progression-extracting unit that extracts a progression of bits according to a preset method in data of an arbitrary portion of the memory;

a data position estimation unit that estimates whether the protected data is stored in the arbitrary portion of the memory by comparing the extracted progression of bits with a preset progression of bits;

a decoded data extraction unit that removes the progression of bits from the data of the arbitrary portion, if it is estimated that the protected data is stored in the arbitrary portion of the memory; and an error-correcting code decoder that decodes the data after the progression of bits has been removed, using an error-correcting code.

10. The apparatus of claim 9, wherein the data position estimation unit estimates that the protected data is stored in the arbitrary portion of the memory, when a correlation between the extracted progression of bits and a preset progression of bits exceeds a preset threshold.

11. The apparatus of claim 9, wherein the preset progression of bits includes a repetition of preset short progressions of bits, and wherein the data position estimation unit:

divides the extracted progression of bits into divided progressions of bits in units based on a length of the short progressions of bits;

calculates a correlation between each of the divided progressions of bits and the short progression of bits; and estimates that the protected data is stored in the arbitrary portion of the memory, when a number of the divided progressions of bits in which the calculated correlation exceeds a first threshold, is larger than a second threshold.

12. The apparatus of claim 9, further comprising a validity determination unit that examines whether the decoded data is valid data.

* * * * *